US008842443B2

(12) United States Patent
Lim et al.

(10) Patent No.: US 8,842,443 B2
(45) Date of Patent: Sep. 23, 2014

(54) PRINTED CIRCUIT BOARD ASSEMBLY FOR A MOBILE TERMINAL AND METHOD FOR FABRICATING THE SAME

(75) Inventors: Gukchan Lim, Seoul (KR); Seehyung Lee, Seoul (KR); Kun Joo, Seoul (KR); Sangmo Park, Seoul (KR); Jinsu Lee, Gyeonggi-Do (KR); Dongchul Jin, Gyeonggi-Do (KR); Sooyoul Yang, Seoul (KR); Yoonho Kim, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 441 days.

(21) Appl. No.: 13/228,357

(22) Filed: Sep. 8, 2011

(65) Prior Publication Data

US 2012/0243195 A1      Sep. 27, 2012

(30) Foreign Application Priority Data

Mar. 25, 2011   (KR) ................ 10-2011-0027171

(51) Int. Cl.
*H04N 1/03*        (2006.01)
(52) U.S. Cl.
USPC .......................................................... 361/814
(58) Field of Classification Search
USPC .......................................................... 361/814
See application file for complete search history.

(56) References Cited

U.S. PATENT DOCUMENTS

| | | | |
|---|---|---|---|
| 6,084,780 A | 7/2000 | Happoya | |
| 7,398,114 B2* | 7/2008 | Gartrell | 455/575.8 |
| 7,409,190 B2* | 8/2008 | Murata | 455/76 |
| 2002/0014351 A1 | 2/2002 | Okada et al. | |
| 2005/0052858 A1* | 3/2005 | Shima | 361/814 |
| 2005/0168961 A1 | 8/2005 | Ono et al. | |
| 2008/0174982 A1* | 7/2008 | Miyamoto et al. | 361/814 |
| 2009/0268423 A1 | 10/2009 | Sakurai et al. | |
| 2009/0321122 A1 | 12/2009 | Mori et al. | |

FOREIGN PATENT DOCUMENTS

| | | |
|---|---|---|
| CN | 1592570 | 3/2005 |
| CN | 101061697 | 10/2007 |
| CN | 101416567 | 4/2009 |
| CN | 101467500 | 6/2009 |
| JP | 2000-031675 | 1/2000 |
| JP | 2001-177235 | 6/2001 |

OTHER PUBLICATIONS

European Patent Office Application Serial No. 11007364.0, Search Report dated Dec. 3, 2013, 7 pages.
The State Intellectual Property Office of the People's Republic of China Application Serial No. 201210027608.4, Office Action dated Apr. 3, 2014, 8 pages.

* cited by examiner

*Primary Examiner* — Forrest M Phillips
(74) *Attorney, Agent, or Firm* — Lee, Hong, Degerman, Kang & Waimey

(57) ABSTRACT

A printed circuit board (PCB) assembly includes a main PCB, a body PCB and a cover PCB. The main PCB has a first electronic component mounted thereon. The body PCB is mounted on the main PCB and includes a cavity therethrough. The first electronic component is positioned within the cavity when the body PCB is mounted on the main PCB. The cover PCB is aligned and mounted on the body PCB to cover the cavity. The cover PCB has a second electronic component mounted on a surface thereof. When the cover PCB is mounted on the body PCB, the second electronic component is positioned within the cavity and faces the main PCB. A method of fabricating the PCB assembly and a mobile terminal including the PCB assembly are also provided.

22 Claims, 10 Drawing Sheets

PRINTED CIRCUIT BOARD ASSEMBLY FOR A MOBILE TERMINAL AND METHOD FOR FABRICATING THE SAME

CROSS-REFERENCE TO RELATED APPLICATION

Pursuant to 35 U.S.C. §119(a), this application claims the benefit of earlier filing date and right of priority to Korean Patent Application No. 10-2011-0027171, filed on Mar. 25, 2011, the contents of which are hereby incorporated by reference herein in its entirety.

FIELD OF THE INVENTION

The present invention relates to a printed circuit board (PCB) assembly having a PCB and electronic components. Although the present invention is suitable for a wide scope of applications, it is particularly suitable for implementation in a slim profile mobile terminal.

DESCRIPTION OF THE RELATED ART

Mobile terminals are presently configured to perform various functions. Such functions include data and voice communications, capturing still images and video via a camera, recording audio, playing music files and outputting music via a speaker system, and displaying images and video on a display. Some mobile terminals include additional functionality that supports game playing, while other mobile terminals are also configured as multimedia players. More recently, mobile terminals have been configured to receive broadcast and multicast signals that permit viewing of content, such as videos and television programs.

Generally, terminals can be classified into mobile terminals and stationary terminals according to a presence or non-presence of mobility. Mobile terminals can also be classified into handheld terminals and vehicle mount terminals according to whether they are configured to be carried by hand.

There are ongoing efforts to support and increase the functionality of mobile terminals. Such efforts include software and hardware improvements, as well as changes and improvements in the structural components that form the mobile terminal. An approach of improving hardware functions will be considered in the present invention.

Printed circuit board (PCB) assemblies include PCBs having electronic components mounted thereon. A reduction in the thickness of PCB assemblies is needed for implementation of slimmer profile mobile terminals.

For example, structural changes to PCB assemblies allow for a reduction in PCB assembly thickness. The reduced thickness of PCB assemblies for mobile terminals allows for slimmer profile mobile terminals.

SUMMARY OF THE INVENTION

Accordingly, the present invention is directed to a high density printed circuit board (PCB) assembly having more electronic components integrated therein and a fabricating method thereof. The present invention is also directed to providing a thinner mobile terminal by maximizing a space for embedding electronic components within a PCB assembly.

To achieve these objects and other advantages and in accordance with the purpose of this specification, as embodied and broadly described herein, a printed circuit board assembly may include a main printed circuit board having a first surface and a second surface, a first electronic component mounted on the second surface, a body printed circuit board having a third surface and a fourth surface, and a cavity extending through the body printed circuit board from the third surface to the fourth surface, a cover printed circuit board having a fifth surface and a sixth surface, and a second electronic component mounted on the fifth surface, wherein the third surface of the body printed circuit board is aligned and mounted on the second surface of the main printed circuit board such that the first electronic component is positioned within the cavity of the body printed circuit board, and wherein the fifth surface of the cover printed circuit board is aligned and mounted on the fourth surface of the body printed circuit board such that the cover printed circuit board covers the cavity of the body printed circuit board and the second electronic component is positioned within the cavity of the body printed circuit board.

In another aspect, a method for fabricating a printed circuit board assembly includes mounting a first electronic component onto a second surface of a main printed circuit board having a first surface and the second surface, mounting a second electronic component onto a fifth surface of a cover printed circuit board having the fifth surface and a sixth surface, mounting the fifth surface of the cover printed circuit board onto a fourth surface of a body printed circuit board having a third surface, the fourth surface, and a cavity extending therethrough from the third surface to the fourth surface, such that the cover printed circuit board covers the cavity of the body printed circuit board and the second electronic component is positioned within the cavity of the body printed circuit board, and mounting the third surface of the body printed circuit board onto the second surface of the main printed circuit board such that the first electronic component is positioned within the cavity of the body printed circuit board.

In a further aspect, a mobile terminal includes a terminal body and a printed circuit board assembly mounted in a space of the terminal body, wherein the printed circuit board assembly includes a main printed circuit board having a first surface and a second surface, a first electronic component mounted on the second surface, a body printed circuit board having a third surface and a fourth surface, and a cavity extending through the body printed circuit board from the third surface to the fourth surface, a cover printed circuit board having a fifth surface and a sixth surface, and a second electronic component mounted on the fifth surface, wherein the third surface of the body printed circuit board is aligned and mounted on the second surface of the main printed circuit board such that the first electronic component of the main printed circuit board is positioned within the cavity, and wherein the fifth surface of the cover printed circuit board is aligned and mounted on the fourth surface of the body printed circuit board such that the cover printed circuit board covers the cavity of the body printed circuit board and the second electronic component is positioned within the cavity of the body printed circuit board.

Further scope of applicability of the present application will become more apparent from the detailed description given hereinafter. However, it should be understood that the detailed description and specific examples are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. The above and other aspects, features, and advantages of the present invention will become more apparent upon consideration of the following description of preferred embodiments, taken in conjunction with the accompanying drawing figures.

In the drawings.

DETAILED DESCRIPTION OF THE INVENTION

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes "module" and "unit" are used for facilitation of the detailed description of the present invention and do not have meanings or functions different from each other. Therefore, significant meanings or roles are not given to the suffixes themselves and it is understood that the terms 'module' and 'unit' can be used together or interchangeably.

The present invention can be applicable to various types of terminals. Examples of such terminals include mobile as well as stationary terminals, such as mobile phones, user equipment, smart phones, DTV, computers, digital broadcast terminals, personal digital assistants, portable multimedia players (PMP), E-books, and navigation systems.

However, by way of non-limiting example only, further description will be provided with regard to a mobile terminal 100. It should be noted that such teachings may apply equally to other types of terminals.

Figure 1:
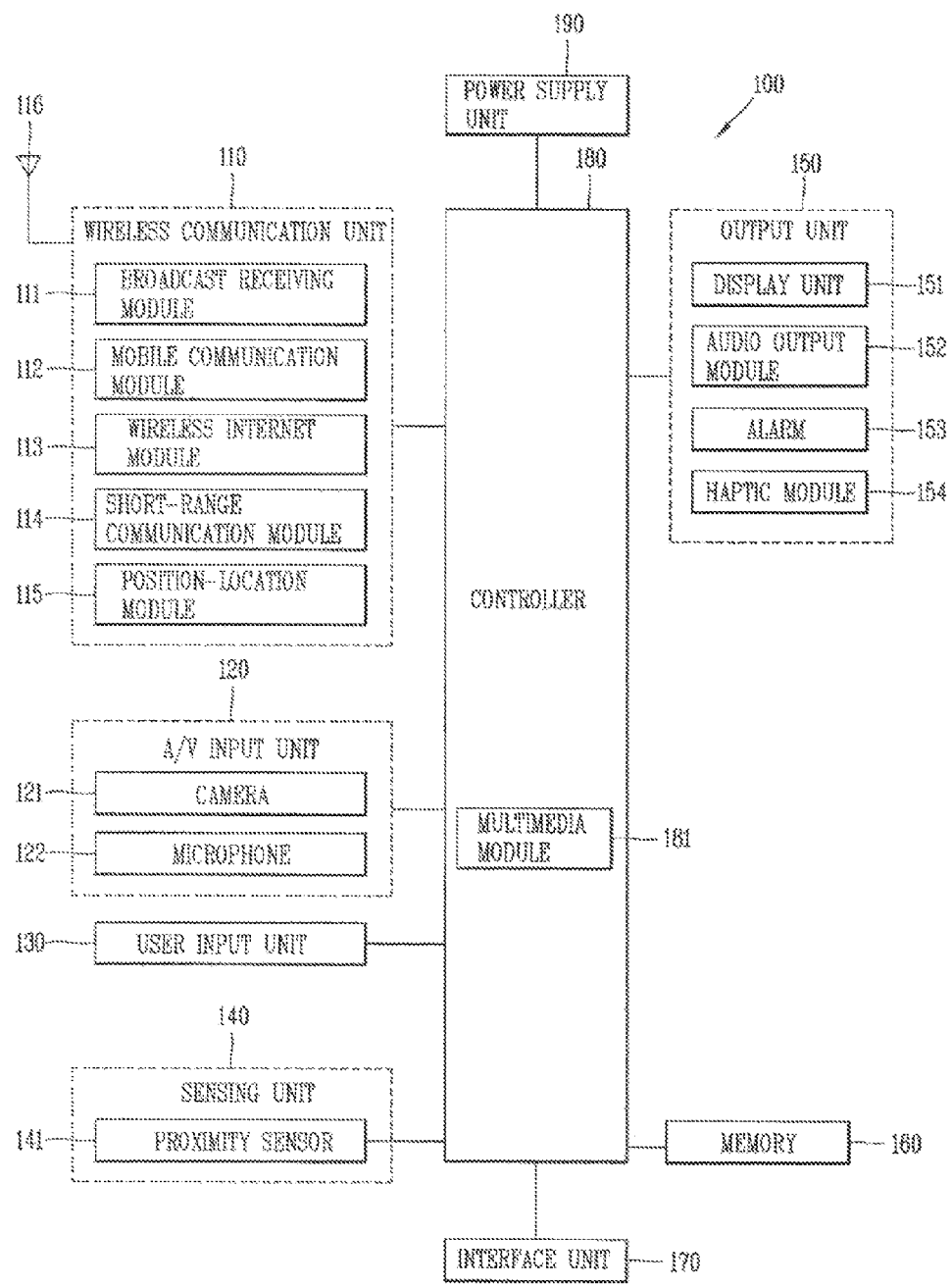
FIG. 1 is a block diagram of a mobile terminal according to an embodiment of the invention.

FIG. 1 is a block diagram of a mobile terminal 100 in accordance with an embodiment of the present invention. Referring to FIG. 1, the mobile terminal 100 includes a wireless communication unit 110, an audio/video (A/V) input unit 120, a user input unit 130, a sensing unit 140, an output unit 150, a memory 160, an interface unit 170, a controller 180, and a power supply unit 190. Although FIG. 1 shows the mobile terminal 100 having various components, it is understood that implementing all of the illustrated components is not a requirement. More or fewer components may alternatively be implemented.

The wireless communication unit 110 includes one or more components that permit wireless communication between the mobile terminal 100 and a wireless communication system or a network within which the mobile terminal 100 is located. For example, the wireless communication unit 110 includes a broadcast receiving module 111, a mobile communication module 112, a wireless Internet module 113, a short-range communication module 114 and a position-location module 115. For non-mobile terminals, the wireless communication unit 110 may be replaced with a wired communication unit. The wireless communication unit 110 and a wired communication unit (not shown) may be commonly referred to as a communication unit.

The broadcast receiving module 111 receives a broadcast signal and/or broadcast associated information from an external broadcast managing entity via a broadcast channel. The broadcast channel may include a satellite channel and/or a terrestrial channel.

The broadcast managing entity may refer to a system that transmits a broadcast signal and/or broadcast associated information. The broadcast managing entity may be a server that generates and transmits broadcast signals and/or broadcast associated information or a server for receiving previously generated broadcast signals and/or broadcast-related information and transmitting the broadcast signals and/or the broadcast associated information to the mobile terminal 100. The broadcast signals may include not only TV broadcast signals, radio broadcast signals, and data broadcast signals, but also signals in the form of a TV broadcast signal combined with a radio broadcast signal.

The broadcast associated information may be information about a broadcast channel, a broadcast program, or a broadcast service provider. The broadcast associated information may even be provided over a mobile communication network, in which case the broadcast associated information may be received via the mobile communication module 112. Examples of broadcast associated information include an electronic program guide (EPG) of digital multimedia broadcasting (DMB) and an electronic service guide (ESG) of digital video broadcast-handheld (DVB-H).

The broadcast receiving module 111 may receive broadcast signals transmitted from various types of broadcast systems. As a non-limiting example, the broadcast systems include digital multimedia broadcasting-terrestrial (DMB-T), digital multimedia broadcasting-satellite (DMB-S), digital video broadcast-handheld (DVB-H), a data broadcasting system known as media forward link only (MediaFLO®) and integrated services digital broadcast-terrestrial (ISDB-T). The broadcast receiving module 111 may also receive multicast signals. The broadcast signals and/or the broadcast associated information received by the broadcast receiving module 111 may be stored in a suitable storage device, such as in the memory 160.

The mobile communication module 112 transmits/receives wireless signals to/from at least one of a base station, an external terminal or a server over a mobile communication network. The wireless signals may represent, for example, voice call signals, video telephony call signals or data in various forms according to the transmission/reception of text and/or multimedia messages.

The wireless Internet module 113 supports Internet access for the mobile terminal 100. The wireless Internet module 113 may be internally or externally coupled to the mobile terminal 100. Suitable technologies for wireless Internet include, but are not limited to, WLAN (Wireless LAN), Wi-Fi®, Wibro® (Wireless broadband), Wimax® (World Interoperability for Microwave Access), and HSDPA (High Speed Downlink Packet Access).

The wireless Internet module 113 may be replaced with a wired Internet module (not shown) in non-mobile terminals. The wireless Internet module 113 and the wired Internet module may be commonly referred to as an Internet module. Moreover, as mentioned in the foregoing description, the wireless Internet module 113 can receive or download the data relevant to the area in which the mobile terminal 100 is located from the external server.

The short-range communication module 114 facilitates relatively short-range communications. Suitable technologies for short-range communication include, but are not limited to, radio frequency identification (RFID), infrared data association (IrDA), ultra-wideband (UWB), as well as networking technologies such as Bluetooth® and ZigBee®.

The position-location module 115 identifies or otherwise obtains a location of the mobile terminal 100. The position-location module 115 may obtain position information by using a global navigation satellite system (GNSS). The GNSS is a term used to describe radio navigation satellite systems configured to send reference signals capable of determining their positions on the surface of the earth or near the surface of the earth while revolving around the earth. The GNSS includes: a global position system (GPS) operated by the U.S.A.; Galileo operated by Europe; a global orbiting navigational satellite system (GLONASS) operated by Russia; Compass operated by China; and a quasi-zenith satellite system (QZSS) operated by Japan.

As a typical example of the GNSS, the position-location module 115 is a GPS module. The position-location module 115 may calculate information related to distances between one point or object and at least three satellites and information related to the time when the distance information was measured and apply trigonometry to the obtained distance information to obtain three-dimensional position information on the point or object according to the latitude, longitude, and altitude at a predetermined time. Furthermore, a method of calculating position and time information using three satellites and correcting the calculated position and time information using another satellite may also used. The position-location module 115 continues to calculate a current position in real time and to calculate velocity information based on the position information.

With continued reference to FIG. 1, the audio/video (A/V) input unit 120 may be configured to provide audio or video signal input to the mobile terminal 100. The A/V input unit 120 may include a camera 121 and a microphone 122. The camera 121 processes image frames of still pictures or video obtained by an image sensor in a photographing mode or a video telephony mode. The processed image frames may be displayed on a display unit 151.

The image frames processed by the camera 121 may be stored in the memory 160 or transmitted to an external device through the wireless communication unit 110. Optionally, the mobile terminal 100 can include two or more cameras 121, if appropriate.

The microphone 122 receives an external audio signal while the mobile terminal 100 is in a particular mode, such as a phone call mode, a recording mode and/or a voice recognition mode. The received audio signal is processed and converted into digital data. In the call mode, the processed digital data is transformed into a format transmittable to a mobile communication base station via the mobile communication module 112 and then output. Furthermore, the mobile terminal 100, and in particular the A/V input unit 120, may include a noise removing algorithm to remove noise generated during the course of receiving the external audio signal.

The user input unit 130 generates input data in response to user manipulation of an associated input device or devices. Examples of such devices include a keypad, a dome switch, a static pressure/capacitance touchpad, a jog wheel and a jog switch. A specific example of the user input unit 130 is a touch screen in which a touchpad is combined with a display, as will be described below.

The sensing unit 140 provides status measurements of various aspects of the mobile terminal 100. For example, the sensing unit 140 may detect an open/closed status of the mobile terminal 100, relative positioning of components, such as a display and a keypad of the mobile terminal 100, a change of position of the mobile terminal 100 or a component of the mobile terminal 100, a presence or absence of user contact with the mobile terminal 100, an orientation of the mobile terminal 100 and/or acceleration/deceleration of the mobile terminal 100.

As an example, the mobile terminal 100 may be configured as a slide-type mobile terminal in which the sensing unit 140 may sense whether a sliding portion of the mobile terminal 100 is open or closed. The sensing unit 140 may also sense a presence or absence of power provided by the power supply unit 190 or a presence or absence of a coupling or other connection between the interface unit 170 and an external device. The sensing unit 140 may include a proximity sensor 141.

The output unit 150 generates output relevant to the senses of sight, hearing and touch. The output unit 150 may include a display unit 151, an audio output module 152, an alarm 153, and a haptic module 154.

The display unit 151 displays information processed by the mobile terminal 100. For example, when the mobile terminal 100 is in a call mode, the display unit 151 may display a user interface (UI) or a graphic user interface (GUI) associated with the call. If the mobile terminal 100 is in a video communication mode or a photograph mode, the display unit 151 may display a photographed and/or received picture, a UI or a GUI.

The display unit 151 may include a liquid crystal display (LCD), a thin film transistor liquid crystal display (TFT LCD), an organic light-emitting diode (OLED), a flexible display, or a 3-dimensional display. The mobile terminal 100 may include one or more of such displays.

The display unit 151 may have a transparent or light-transmittive type configuration, hereinafter referred to as a transparent display. A transparent OLED (TOLED) is an example of a transparent display. A rear configuration of the display unit 151 may also have the light-transmittive type configuration. In this configuration, a user is able to see an object located behind the terminal body via the area occupied by the display unit 151 of the terminal body.

At least two display units 151 may be provided. For example, a plurality of display units 151 may be provided on a single face of the mobile terminal 100 spaced apart from each other or built in one body. Alternatively, each of a plurality of display units 151 may be provided on different faces of the mobile terminal 100.

If the display unit 151 and a sensor for detecting a touch action (hereafter referred to as a 'touch sensor') are constructed in a mutual-layered structure (hereafter referred to as a 'touch screen'), the display unit 151 may be used as an input device and an output device. For example, the touch sensor may include a touch film, a touch sheet or a touchpad.

The touch sensor can be configured to convert a pressure applied to a specific portion of the display unit 151 or a variation of electrostatic capacity generated from a specific portion of the display unit 151 to an electric input signal. The touch sensor may detect a pressure of a touch as well as a touched position or magnitude of the touch.

If a touch input is made to the touch sensor, a signal(s) corresponding to the touch input is transferred to a touch controller (not shown). The touch controller processes the signal(s) and then transfers corresponding data to the controller 180. The controller 180 may determine which portion of the display unit 151 is touched.

With continued reference to FIG. 1, a proximity sensor 141 can be provided within the mobile terminal 100 enclosed by the touch screen or around the touch screen. The proximity sensor 141 may detect a presence or non-presence of an object approaching a specific detecting surface or an object existing around the proximity sensor 141 using an electromagnetic field strength or infrared ray without mechanical contact. Accordingly, the proximity sensor 141 may have greater durability and greater utility than a contact type sensor.

The proximity sensor 141 can include a transmittive photoelectric sensor, a direct reflective photoelectric sensor, a mirror reflective photoelectric sensor, a radio frequency oscillation proximity sensor, an electrostatic capacity proximity sensor, a magnetic proximity sensor or an infrared proximity sensor. If the touch screen is an electrostatic type touch screen, the proximity sensor 141 may detect proximity of a pointer using a variation of an electric field according to the proximity of the pointer and the touch screen or touch sensor may be classified as the proximity sensor 141.

An action in which a pointer approaches the touch screen without contacting the touch screen, yet is recognized as being located on the touch screen, is referred to as a 'proximity touch'. An action in which the pointer actually touches the touch screen is referred to as a 'contact touch'. The position on the touch screen proximity-touched by the pointer refers to the position of the pointer that vertically opposes the touch screen when the pointer performs the proximity touch.

The proximity sensor 141 may detect a proximity touch and/or a proximity touch pattern, such as proximity touch distance, proximity touch duration, proximity touch position or proximity touch shift state. Information corresponding to the detected proximity touch action and/or the detected proximity touch pattern may be displayed on the touch screen.

The audio output module 152 may output audio data that is received from the wireless communication unit 110 in, for example, a call-receiving mode, a call-placing mode, a recording mode, a voice recognition mode or a broadcast receiving mode. The audio output module 152 may output audio data stored in the memory 160. The audio output module 152 may output an audio signal relevant to a function, such as a call signal receiving sound, or a message receiving sound performed by the mobile terminal 100. The audio output module 152 may include, for example, a receiver, a speaker or a buzzer.

The alarm 153 outputs a signal for announcing an occurrence of a particular event associated with the mobile terminal 100. Typical events include a call signal reception, a message reception, a key signal input and a touch input. The alarm 153 may output a signal for announcing the event occurrence via vibration as well as a video signal or an audio signal. The video signal is output via the display unit 151 and the audio signal is output via the audio output module 152. Therefore, at least the display unit 151 or the audio output module 152 can be regarded as part of the alarm 153.

The haptic module 154 may generate various haptic effects that can be sensed by a user. Vibration is a representative tactile effect generated by the haptic module 154. Strength and pattern of the vibration generated from the haptic module 154 may be controllable. For example, vibrations differing from each other can be output by being synthesized together or can be output in sequence.

The haptic module 154 may generate various haptic effects in addition to vibration. For example, the haptic module 154 may generate an effect caused by a pin array vertically moving against skin being touched, an air injection force via an injection hole, an air suction force via a suction hole, an effect of skimming on a skin surface, an effect of contact with an electrode, an effect of electrostatic power and/or an effect of a hot/cold sense using an endothermic or exothermic device.

The haptic module 154 can be configured to provide the haptic effect via direct contact. The haptic module 154 can also be configured to enable a user to experience the haptic effect via muscular sense of a finger or an arm. Two or more haptic modules 154 can be provided according to a configuration of the mobile terminal 100.

The memory 160 is generally used to store various types of data for supporting the processing, control, and storage requirements of the mobile terminal 100. Examples of such data include program instructions for applications operating on the mobile terminal 100, contact data, phonebook data, messages, audio, still pictures, and moving pictures. A recent use history or a cumulative use frequency of each data, such as use frequency for each phonebook, each message or each multimedia, may be stored in the memory 160. Moreover, data for various patterns of vibration and/or sound to be output when a touch input is received at the touch screen may be stored in the memory 160.

The memory 160 may include, for example, a flash memory, a hard disk, a multimedia card micro type memory, a random access memory (RAM), a static random access memory (SRAM), a read-only memory (ROM), an electrically erasable programmable read-only memory (EEPROM), a programmable read-only memory (PROM), a magnetic memory, a magnetic disk an optical disk, or a card type memory, such as SD memory or XD memory. The mobile terminal 100 may operate in association with a web storage that performs a storage function of the memory 160 via the Internet.

The interface unit 170 couples the mobile terminal 100 with external devices. The interface unit 170 receives data from an external device. The interface unit 170 is supplied with power and may be configured to deliver the power to elements within the mobile terminal 100.

The interface unit 170 may be configured to enable data to be transferred from the mobile terminal 100 to an external device. The interface unit 170 may be configured to include a wired/wireless headset port, an external charger port, a wire/wireless data port, a memory card port, a port for coupling to a device having an identity module, an audio input/output (I/O) port, a video input/output (I/O) port or an earphone port.

The identity module is a chip or card that stores various types of information for authenticating a use authority of the mobile terminal 100 and can include a user identity module (UIM), a subscriber identity module (SIM) and/or a universal subscriber identity module (USIM). A device provided with the above identity module (hereafter referred to as an 'identity device') may be manufactured in the form of a smart card. The identity device is connectable to the mobile terminal 100 via a corresponding port.

The interface unit 170 may be configured as a passage for supplying power to the mobile terminal 100 from a cradle that is connected to the mobile terminal 100. The interface unit 170 may facilitate delivery of various command signals, which are input via the cradle by a user, to the mobile terminal 100. Various command signals input via the cradle or the power may provide an indication for recognizing that the mobile terminal 100 is correctly loaded in the cradle.

The controller 180 typically controls the overall operations of the mobile terminal 100. For example, the controller 180 performs control and processing associated with voice calls, data communications and video conferences. The controller 180 may include a multimedia module 181 that provides multimedia playback. The multimedia module 181 may be configured as part of the controller 180 or may be configured as a separate component. The controller 180 may also perform pattern recognition processing for recognizing a handwriting input performed on the touch screen as a character and/or recognizing a picture drawing input performed on the touch screen as characters or images.

The power supply unit 190 provides power required by the various components of the mobile terminal 100. The power may be internal power, external power, or combinations thereof.

Embodiments of the present invention described in the following description may be implemented within a recording medium that can be read by a computer or a computer-like device using software, hardware or combinations thereof. For hardware implementations, arrangements and embodiments may be implemented using at least one of application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors or electrical units for performing other functions. Such embodiments may also be implemented by the controller 180.

For a software implementation, arrangements and embodiments described herein may be implemented with separate software modules, such as procedures and functions, each of which may perform one or more of the functions and operations described herein. Software codes may be implemented with a software application written in any suitable programming language and may be stored in the memory 160 and executed by the controller 180.

Figure 2:
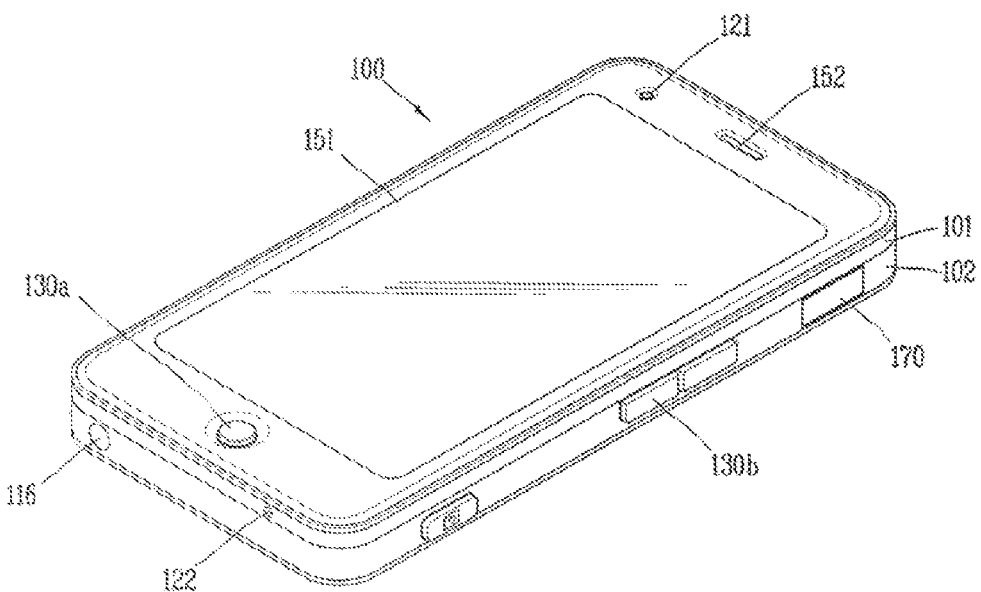
FIG. 2 is a front perspective view of the mobile terminal according to an embodiment of the invention.

FIG. 2 is a front perspective view showing an example of a front of the mobile terminal 100. The mobile terminal 100 of FIG. 2 is depicted as a bar-type terminal body. However, the mobile terminal 100 may be implemented in a variety of different configurations.

Examples of such configurations include a folder-type, a slide-type, a rotational-type, a swing-type and combinations thereof. For clarity, further disclosure will primarily relate to a bar-type mobile terminal 100. However such teachings apply equally to other types of mobile terminals.

The mobile terminal 100 includes a case, such as a casing, housing, or cover, that forms an exterior of the mobile terminal. The case may be divided into a front case 101 and a rear case 102. Various electric/electronic parts are provided in a space between the front case 101 and the rear case 102. A middle case may be further provided between the front case 101 and the rear case 102. The cases can be formed by injection molding of synthetic resin or may be formed of a metallic material, such as stainless steel (STS) or titanium (Ti).

The display unit 151, audio output module 152, camera 121, first and second user manipulating units 130a and 130b, microphone 122 and/or the interface unit 170 can be provided on the terminal body, and more particularly on the front case 101.

The display unit 151 occupies most of a main face of the front case 101. The audio output module 152 and the camera 121 may be provided at an area adjacent to one end portion of the display unit 151, while the first manipulating unit 130a and the microphone 122 may be provided at an area adjacent to the other, opposite end portion of the display unit 151. The second manipulating unit 130b and the interface unit 170 can be provided on lateral sides of the front and rear cases 101 and 102.

The user input unit 130 (see FIG. 1) may receive a command for controlling an operation of the mobile terminal 100. The user input unit 130 may include a plurality of manipulating units, such as the first and second manipulating units 130a and 130b. The first and second user manipulating units 130a and 130b can be named a manipulating portion and may adopt any mechanism of a tactile manner that enables a user to perform a manipulation action by experiencing a tactile feeling.

Content input via the first manipulating unit 130a or the second manipulating unit 130b can be set to be different. For example, commands such as start, end and scroll can be input via the first manipulating unit 130a. Commands for adjusting volume of sound output from the audio output module 152 and for switching the display unit 151 to a touch recognizing mode can be input via the second manipulating unit 130b.

Figure 3:
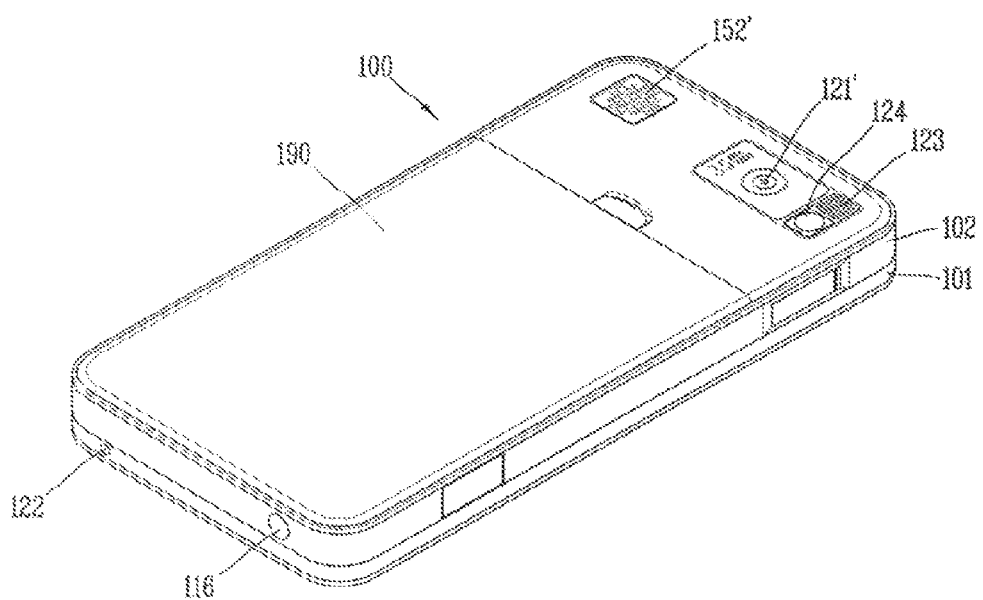
FIG. 3 is a rear perspective view of the mobile terminal shown in FIG. 2.

FIG. 3 is a rear perspective diagram of the mobile terminal 100 shown in FIG. 2. Other embodiments, configurations and arrangements may also be provided.

As shown in FIG. 3, an additional camera 121' can be provided on a rear side of the terminal body, and more particularly, on the rear case 102. The camera 121' on the rear case 102 has a photographing direction that is substantially opposite to that of the camera 121 shown in FIG. 2 and may have a different resolution.

For example, the camera 121 may have a smaller number of pixels than the camera 121', and thereby have a relatively lower resolution, to capture and transmit an image of the user's face for a video call. On the other hand, the camera 121' may have a greater number of pixels than the camera 121, and thereby have a relatively greater resolution, for capturing an image of a general subject for photography without transmitting the captured image.

A flash 123 and a mirror 124 may be disposed adjacent to the camera 121'. The flash 123 projects light toward a subject when photographing the subject using the camera 121'. When a user attempts to take a picture of himself/herself (self-photography) using the camera 121', the mirror 124 enables the user to view his/her face reflected by the mirror 124.

An additional audio output module 152' can be disposed at the rear side of the terminal body. The additional audio output module 152' facilitates a stereo function in conjunction with the audio output module 152 illustrated in FIG. 2 and may be used for implementation of a speakerphone mode when communicating via the mobile terminal 100.

A broadcast signal receiving antenna 116 can be provided at a lateral side of the terminal body in addition to an antenna for communication. The antenna 116 incorporated into the broadcast receiving module 111 shown in FIG. 1 can be retractable within the terminal body.

The power supply unit 190 for supplying a power to the mobile terminal 100 may be provided in the terminal body. The power supply unit 190 can be configured to be built within the terminal body or to be detachably connected to the terminal body.

Figure 4:
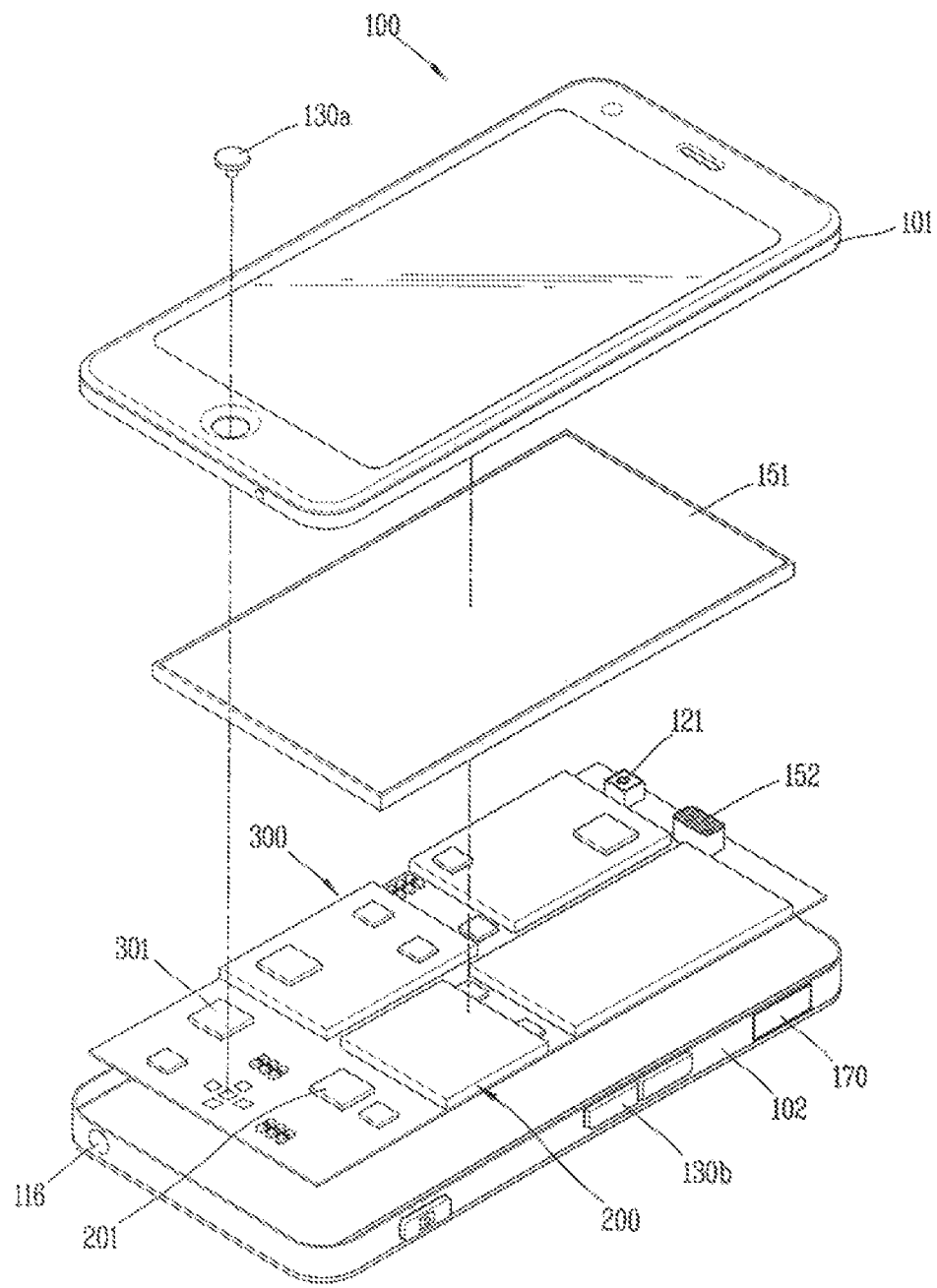
FIG. 4 is a perspective view of the mobile terminal shown in FIG. 2 in a disassembled condition.

FIG. 4 is a perspective view of the mobile terminal 100 of FIG. 2 in a disassembled condition, which shows PCB assemblies 200 and 300 for accommodating various electronic components. Referring to FIG. 4, the PCB assemblies 200 and 300 may be positioned within a space inside the terminal body and may be mounted onto either the rear case 102, as shown, or onto the front case 101. The PCB assemblies 200, 300 may occupy most of the main surface of the terminal body. Alternatively, a plurality of PCB assemblies 200, 300 may be provided so that electronic components can be distributively positioned on the plurality of PCBs.

The PCB assemblies 200, 300 may provide a space for accommodating various electronic components therein. As depicted in FIG. 4, a surface of the PCB assemblies 200, 300 may have a display unit 151a electrically coupled thereto.

The PCB assembly 200, 300 may be implemented as one example of the controller 180 (FIG. 1) for controlling the mobile terminal 100 to perform various functions. The PCB assembly 200, 300 may be configured to control the display unit 151 to output information processed in the mobile terminal 100.

Hereinafter, a detail description will be provided of the high-density PCB assembly 200, on which electronic components are compactly integrated. The compact integration of the electronic components on the PCB assembly 200 provides a PCB assembly having a smaller profile, which in turn enables the mobile terminal 100 to be slimmer.

Figure 5:
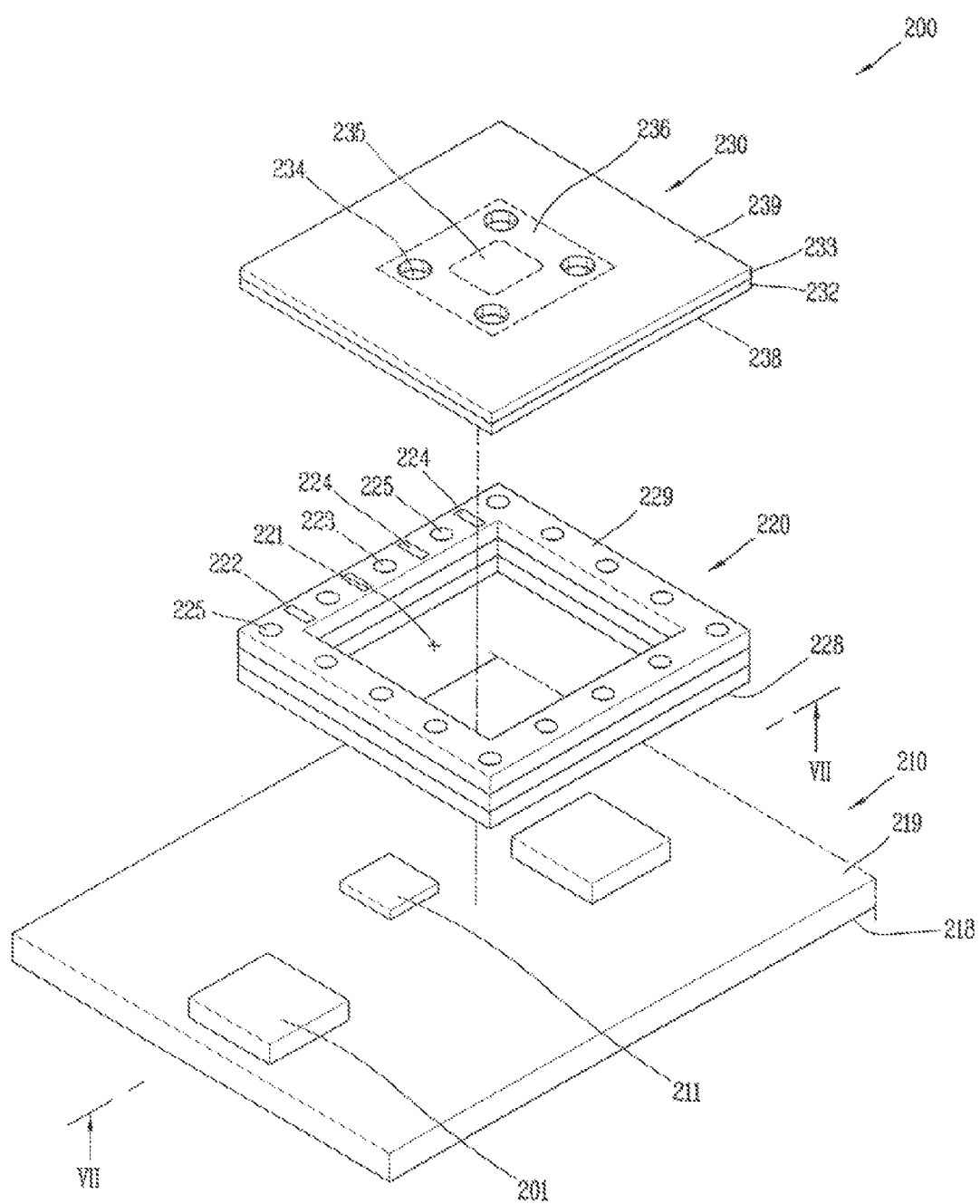
FIG. 5 is a top perspective view of an embodiment of the PCB assembly shown in FIG. 4 in a disassembled condition.
Figure 6:
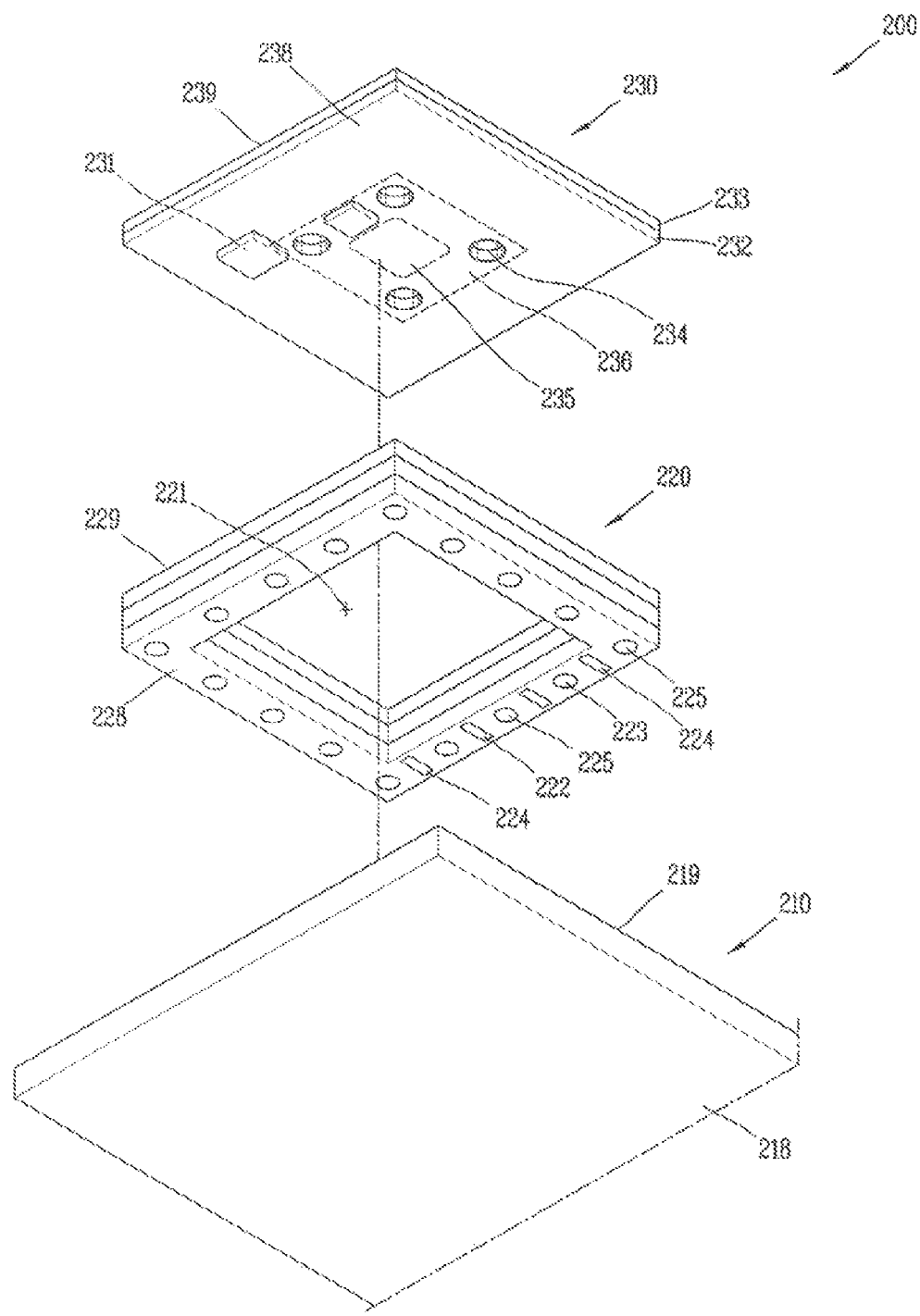
FIG. 6 is a bottom perspective view of an embodiment of the PCB assembly shown in FIG. 4 in a disassembled condition.

FIG. 5 is a top perspective view depicting the PCB assembly 200 of FIG. 4 in a disassembled condition. FIG. 6 is a bottom perspective view depicting the PCB assembly 200 of FIG. 4 in a disassembled condition. Referring to FIGS. 5 and 6, the PCB assembly 200 may include a main PCB 210, a body PCB 220 and a cover PCB 230. The main PCB 210 includes a first surface 218 and a second surface 219, the body PCB 220 includes a third surface 228 and a fourth surface 229, and the cover PCB 230 includes a fifth surface 238 and a sixth surface 239.

Each of the main PCB 210, body PCB 220 and cover PCB 230 may include an insulating substrate and circuit patterns. The insulating substrates may define an appearance of each of the main PCB 210, body PCB 220 and cover PCB 230, provide electric insulation, and function as a basic member providing durability to the PCB assembly 200. The insulating substrate may be formed of a material, such as epoxy resin, bismaleimide triazine (BT) resin, or aramid resin.

Circuit patterns produced on a surface of each of the insulating substrates may form a circuit of the PCB assembly 200. The circuit patterns may be produced, for example, by coating a copper layer of the insulating substrate with a dry film, and sequentially performing exposure, development and etching according to preset patterns, thereby leaving a copper circuit pattern on the surface of the insulating substrate. Alternatively, the circuit patterns may be formed by forming a pattern on a half-hardened insulating substrate and pressing the pattern into the substrate using a press.

The main PCB 210 may define a bottom surface of the PCB assembly 200 and the first surface 218 of the main PCB may be mounted on the rear case 102 (see FIG. 4) of the mobile terminal 100. Various electronic components, including a first electronic component 211, may be disposed on the main PCB 210, such as on the second surface 219 of the main PCB. The main PCB 210 may perform a main function of the controller 180 (see FIG. 1) for operating various functions of the mobile terminal 100.

The body PCB 220 may be mounted on the main PCB 210 to cover the main PCB. More particularly, the third surface 228 of the body PCB 220 may be mounted to the second surface 219 of the main PCB 210.

The body PCB 220 may have a cavity 221 in which the first electronic component 211 is positioned. The cavity 221 extends through the body 220 PCB from the third surface 228 to the fourth surface 229. The body PCB 220 may be constructed by laminating a plurality of insulating substrates to a preset height.

The cover PCB 230 may be aligned and mounted onto the body PCB 220 to cover the cavity 221, such that the fifth surface 238 of the cover PCB 230 is mounted on the fourth surface 229 of the body PCB 220. Accordingly, the fifth surface 238 of the cover PCB 230 faces the main PCB 210.

The fifth surface 238 of the cover PCB 230 may have a second electronic component 231 (see FIG. 6) mounted thereon. When the cover PCB 230 is aligned and mounted on the body PCB 220, the second electronic component 231 may be positioned within the cavity 221. The second electronic component 231 may be electrically coupled to the main PCB 210 via the cover PCB 230 and body PCB 220.

As electronic components having different heights are mounted on the main PCB 210, the space between the electronic components and the cover PCB 230 can be minimized. Similarly, as electronic components having different heights are mounted on the cover PCB 230, the space between the electronic components and the main PCB 210 can be minimized. Moreover, electronic components mounted on the second surface 219 of the main PCB 210 can be offset from electronic components mounted on the fifth surface 238 of the cover PCB 230 such that they do not occupy the same space as each other in the cavity 221. The result is a thin, high-density PCB assembly 200 having more integrated electronic components incorporated therein that allows the mobile terminal 100 in which the PCB assembly is included to be slimmer.

Figure 7:
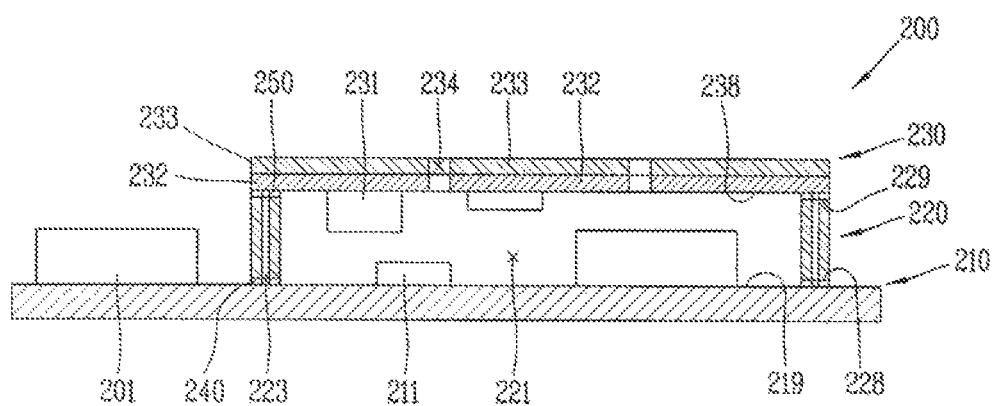
FIG. 7 is a sectional view taken along line VII-VII of FIG. 5.

FIG. 7 is a sectional view taken along line VII-VII of FIG. 5. As depicted in FIG. 7, the body PCB 220 may be mounted on the main PCB 210 and the cover PCB 230 may be mounted on the body PCB 220 by Surface Mount Technology (SMT). More particularly, the third surface 228 of the body PCB 220 may be mounted on the second surface 219 of the main PCB 210, and the fifth surface 238 of the cover PCB 230 may be mounted on the fourth surface 229 of the body PCB 220.

As an example of a process for mounting the body PCB 220 onto the main PCB 210, leads are patterned on the main PCB 210, such as on the second surface 219 of the main PCB 210, and the third surface 228 of the body PCB 220 is put on the leads using a mounting device and soldered onto the main PCB 210 using a reflow oven. Following this process, the body PCB 220 is electrically coupled to the main PCB 210.

When the body PCB 220 is mounted on the main PCB 210, a first coupled layer 240 may be formed between the third surface 228 of the body PCB 220 and the second surface 219 of the main PCB 210. The first coupled layer 240 may be formed as the patterned lead is melted and then solidified. Similarly, a second coupled layer 250, which is formed as the patterned lead is melted and then solidified, may be located between the fifth surface 238 of the cover PCB 230 and the fourth surface 229 of the body PCB 220.

Referring to FIGS. 5-7, the body PCB 220 may be provided with a body signal unit 222 for electrically coupling the body PCB 220 to the main PCB 210. The body signal unit 222 may extend through the body PCB 220 in a thickness direction, such as from the third surface 228 to the fourth surface 229.

The body signal unit 222 may include a plurality of signal vias 224. An example for forming the signal vias 224 of the signal unit 222 includes coating an insulating substrate of the body PCB 220 with a dry film according to a preset pattern, performing exposure, development and etching processes to construct a copper foil circuit, and performing copper plating.

The body PCB 220 may also be provided with a body ground unit 223 that provides electromagnetic interference (EMI) shielding or blocking between the cavity 221 and an area outside the PCB assembly 200 to minimize EMI. The body ground unit 223 may be configured to surround the cavity 221.

As an example, the body ground unit 223 may include a plurality of ground vias 225 extending through the body PCB 220 in a thickness direction, such as from the third surface 228 to the fourth surface 229. The plurality of ground vias 225 may be positioned spaced apart from one another at preset intervals along a periphery of the body PCB 220 to provide the EMI shielding. Each signal via 224 may be positioned between a pair of ground vias 225.

The cover PCB 230 may include a laminated structure of a signal layer 232 and a ground layer 233 with the ground layer 233 aligned to overlap the signal layer 232. The signal layer 232 may include the fifth surface 238 and form a bottom surface of the cover PCB 230.

Accordingly, the signal layer 232 is mounted on the fourth surface 229 of the body PCB 220 to cover the cavity 221 and the second electronic component 231 is mounted on a surface (fifth surface 238) facing the main PCB 210. The second electronic component 231 may be positioned within the cavity 221 of the body PCB 220.

The signal layer 232 may be electrically coupled to the body signal unit 222. Hence, the second electronic component 231 may be electrically coupled to the main PCB 210 via the signal layer 232 and the signal vias 224 of the body signal unit 222.

The ground layer 233 may provide EMI shielding, similar to the body ground unit 223. Together, the body ground unit 223 of the body PCB 220 and the ground layer 233 of the cover PCB 230 are positioned to cover side surfaces and a top surface of the cavity 221 to provide EMI shielding between the cavity 221 and an area outside the PCB assembly 200, thereby minimizing EMI between an electronic component, such as a radio frequency (RF) component, positioned outside the PCB assembly 200 and the first and second electronic components 211 and 231 positioned within the cavity 221.

By utilizing the body ground unit 223 of the body PCB 220 and the ground layer 233 of the cover PCB 230, the PCB assembly 200 does not require a separate shielding can for covering the electronic components to provide EMI shielding. This permits maximization of mounting space for the electronic components while providing a PCB assembly 200 capable of shielding the EMI.

To facilitate assembly of the PCB assembly 200, the cover PCB 230 may include a first region 235 formed at a central portion thereof and a second region 236 formed surrounding the first region 235. The first region 235 may define a space utilized by a vacuum pick-up device for lifting the cover PCB 230 via a vacuum force during an SMT process. Accordingly, the first region 235 may preferably be flat with low surface roughness.

The cover PCB 230 may include at least one ventilation hole 234. The at least one ventilation hole 234 allows heat generated by electronic components positioned within the cavity 221, such as the first electronic component 211 and/or the second electronic component 231, to be discharged from the cavity 221.

The at least one ventilation hole 234 may be a plurality of ventilation holes positioned within the second region 236 of the cover PCB 230 at specific intervals along the periphery of the second region 236. A surface area occupied by the at least one ventilation hole 234 may determined so as to allow sufficient discharging of heat generated by electronic components positioned within the cavity 221, while at the same time providing adequate EMI shielding.

Figure 8:
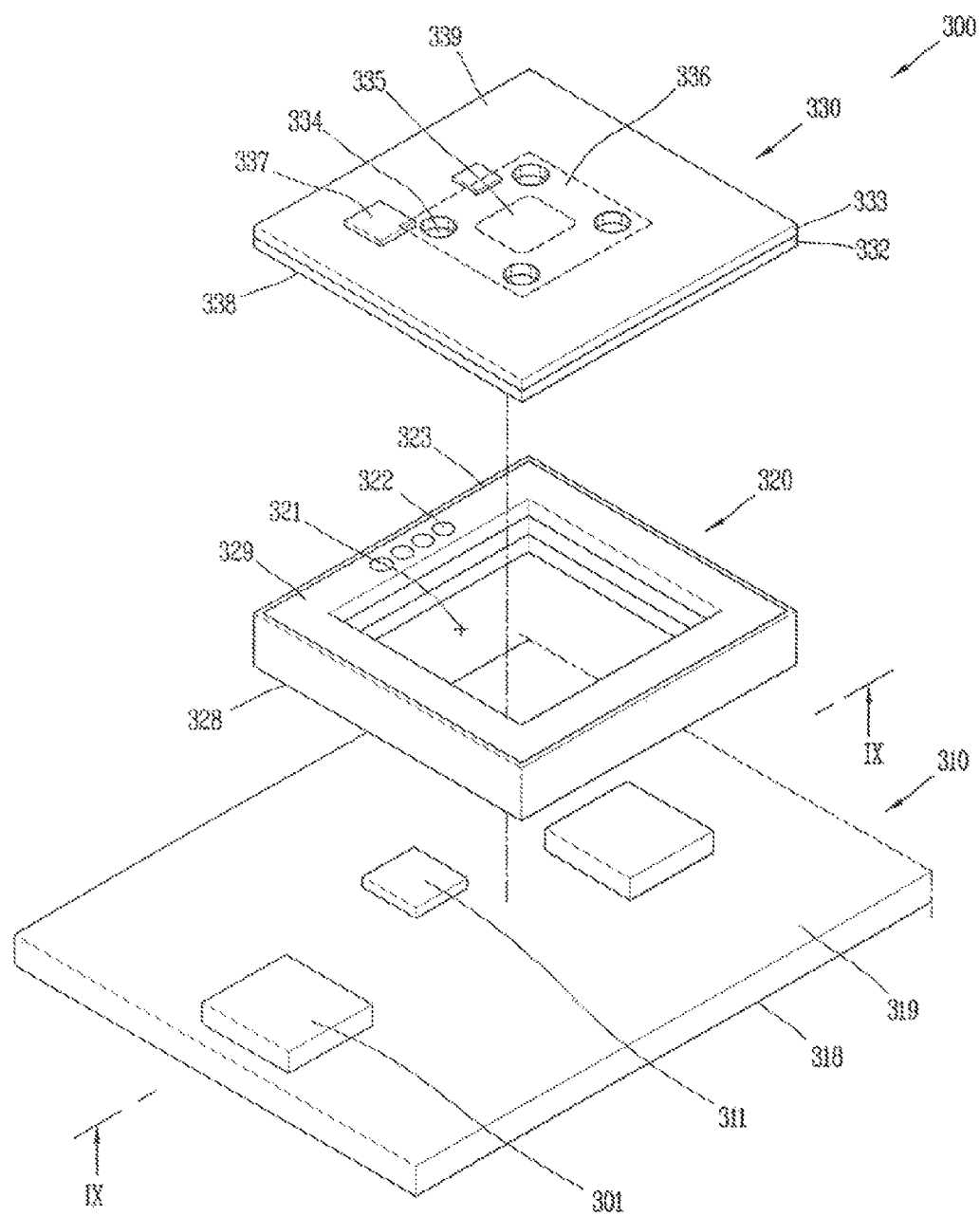
FIG. 8 is a top perspective view of an embodiment of the PCB assembly shown in FIG. 4 in a disassembled condition.
Figure 9:
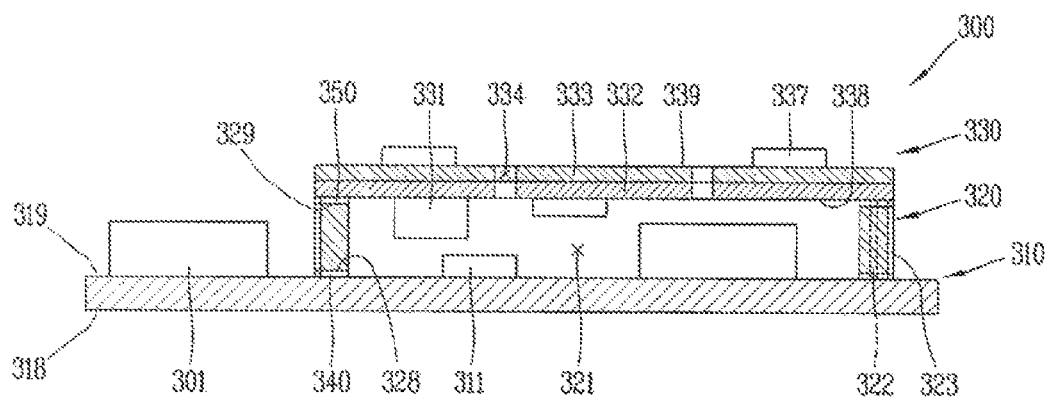
FIG. 9 is a sectional view taken along line IX-IX of FIG. 8.

FIG. 8 is a top perspective of an embodiment of the PCB assembly 300 shown in FIG. 4 in a disassembled condition. FIG. 9 is a sectional view taken along the line IX-IX of FIG. 8.

Referring to FIGS. 8 and 9, the PCB assembly 300 may have a configuration similar to the PCB assembly 200. However, the PCB assembly 300 includes a body ground unit 323 and a third electronic component 337. Description will now be given of a body PCB 320 having the body ground unit 323 and a cover PCB 330 having the third electronic component 337.

The body PCB 320 may include a body ground unit 323 formed to surround a cavity 321 to provide EMI shielding between the cavity 321 and an area outside the PCB assembly 300 to minimize EMI. For example, the body ground unit 323 may wrap around a side wall of the body PCB 320 and be configured as a plated layer. The plated layer of the body ground unit 323 wraps completely around the cavity 321 and may have an advantage of shielding the EMI with more certainty in comparison to the ground vias 225 of the body ground unit 223 of the PCB assembly 200 of FIGS. 5 and 6. The plated layer of the body ground unit 323 also eliminates the process of forming the ground vias 225 of the body ground unit 223 of the PCB assembly 200 of FIGS. 5 and 6, which may enable the body PCB 320 to have a thinner side wall thickness than the body PCB 220 of the PCB assembly 200 of FIGS. 5 and 6.

A second electronic component 331 (see FIG. 9) may be positioned on a fifth surface 338 of the cover PCB 330 and a third electronic component 337 may be positioned on a sixth surface 339 of the cover PCB 330. When the cover PCB 330 is aligned and mounted on a fourth surface 329 of the body PCB 320, the second electronic component 331 may be positioned within the cavity 321 while the third electronic component 337 is positioned on an exterior surface of the PCB assembly 300.

The third electronic component 337 may be electrically coupled to the main PCB 310 via a signal layer 332 of the cover PCB 330 and a body signal unit 322 of the body PCB 320. The third electronic component 337 may be mounted on a ground layer 333 of the cover PCB 330 or on a second signal layer (not shown) laminated on the ground layer 333 and including the sixth surface 339 of the cover PCB 330.

To facilitate assembly of the PCB assembly 300, the cover PCB 330 may include a first region 335 formed at a central portion thereof and a second region 336 formed surrounding the first region 335. The first region 335 may define a space utilized by a vacuum pick-up device for lifting the cover PCB 330 via a vacuum force during a SMT process. Accordingly, the first region 335 may preferably be flat with low surface roughness.

The cover PCB 330 may include at least one ventilation hole 334. The at least one ventilation hole 334 allows heat generated by electronic components positioned within the cavity 321, such as a first electronic component 311 and/or the second electronic component 331, to be discharged from the cavity 321.

The at least one ventilation hole 334 may be a plurality of ventilation holes positioned within the second region 336 of the cover PCB 330 at specific intervals along the periphery of the second region 336. A surface area occupied by the at least one ventilation hole 334 may determined so as to allow sufficient discharging of heat generated by electronic components positioned with the cavity 321 while providing adequate EMI shielding.

The third electronic component 337 may be positioned at the second region 336 of the cover PCB 330. Being positioned on an exterior surface of the PCB assembly 300, the third electronic component 337 may be an electronic component that does not require EMI shielding. The third electronic component 337 may be electrically coupled to the main PCB 310 via a signal connection portion (not shown) of the cover PCB 330 extending from the signal layer 332 of the cover PCB 330 to the ground layer 333 of the cover PCB 330.

When a third surface 328 of the body PCB 320 is mounted onto a second surface 319 of the base PCB 310 and the fifth surface 338 of the cover PCB 330 is mounted on a fourth surface 329 of the base PCB 320, the first electronic component 311 may be positioned within the cavity 321 of the body PCB 320 and the cover PCB 330 may cover the cavity 321. Moreover, the second electronic component 331 may be positioned within the cavity 321.

The result is a thin, high-density PCB assembly 300 having more integrated electronic components incorporated therein that allows the mobile terminal 100 in which the PCB assembly is included to be slimmer. The PCB assembly 300 also maximizes a mounting space for the electronic components.

The body PCB 320 may include the body ground unit 323 and the cover PCB 330 may include the ground layer 333. The body ground unit 323 of the body PCB 320 and the ground layer 333 of the cover PCB 330 provide EMI shielding between the cavity 321 and an area outside the PCB assembly 300. Accordingly, the PCB assembly 300 is adapted to provide EMI shielding.

Figure 10:
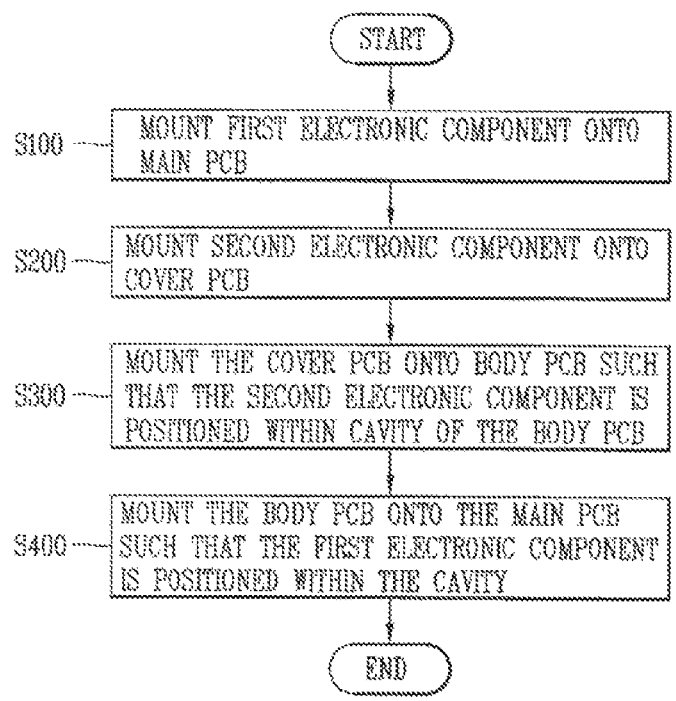
FIG. 10 is a flowchart depicting a method of fabricating a PCB assembly according to an embodiment of the invention.
Figure 11A:
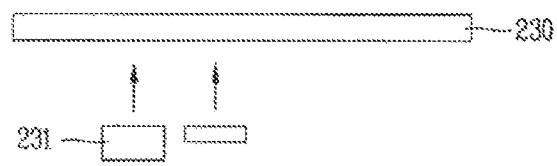
FIGS. 11A to 11F are views depicting a process of fabricating a PCB assembly according to an embodiment of the invention.
Figure 11B:
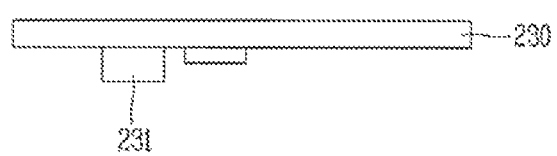
Figure 11C:
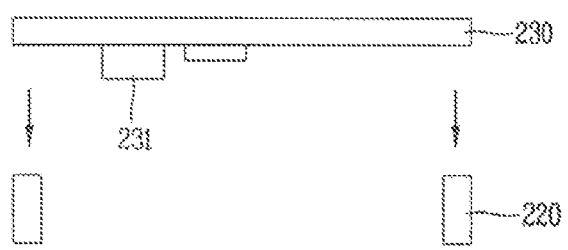
Figure 11D:
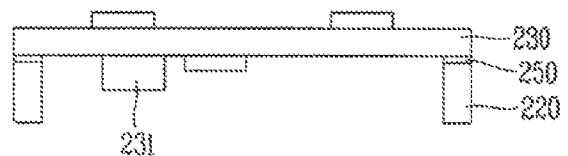
Figure 11E:
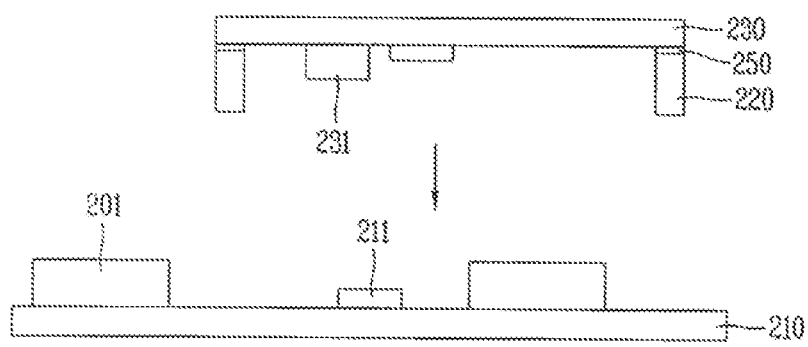
Figure 11F:
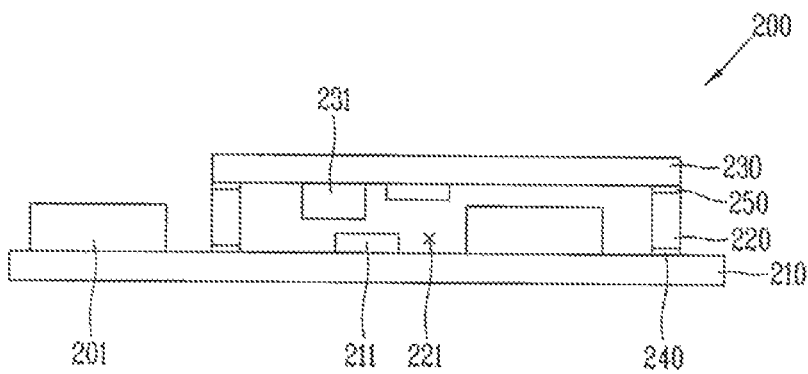

FIG. 10 is a flowchart depicting a method of fabricating the PCB assembly 200 according to an embodiment of the invention. FIGS. 11A to 11F are views depicting a process of fabricating a PCB assembly according to an embodiment of the invention.

Referring to FIGS. 10 and 11A to 11F, a method for fabricating the PCB assembly 200 may include mounting the first electronic component 211 onto the main PCB 210 (S100), mounting the second electronic component 231 onto the cover PCB 230 (S200), mounting the cover PCB 230 onto the body PCB 220 such that the second electronic component 231 is positioned within the cavity 221 of the body PCB 220 (S300), and mounting the body PCB 220 onto the main PCB 210 such that the first electronic component 211 is positioned within the cavity 221 (S400).

More specifically, the first electronic component 211 is mounted onto the main PCB 210 and the second electronic component 231 is mounted onto the cover PCB 230. A third electronic component may further be mounted onto the cover PCB 230 on a surface opposite to the surface of the cover PCB 230 on which the second electronic component 231 is mounted. Mounting of the first electronic component 211 onto the main PCB 210 may be carried out before an assembly formed by the body PCB 220 and cover PCB 230, which have already been coupled to each other, is coupled onto the main PCB 210.

The body PCB 220 may be formed as a plurality of insulating substrates laminated to a preset height. Forming of the body PCB 220 may include a process of forming a body signal unit 222 (see FIGS. 5 and 6) and a body ground unit 223 (see FIGS. 5 and 6). The cavity 221 may be formed in the body PCB 220 via a routing process.

The cover PCB 230 may be mounted onto the body PCB 220 by a SMT process. The cover PCB 230 may be aligned on the body PCB 220 such that the second electronic component 231 is positioned within the cavity 221 of the body PCB 220.

The assembly formed by the body PCB 220 and cover PCB 230 may be mounted onto the main PCB 210 using the SMT process. The pick-up device may lift the assembly formed by the body PCB 220 and cover PCB 230 via a vacuum force applied to the first region 235 (see FIGS. 5 and 6) of the cover PCB 230 and position the assembly on the main PCB 210. With the assembly formed by the body PCB 220 and cover PCB 230 positioned on the main PCB 210, the first electronic component 211 and the second electronic component 231 may be positioned within in the cavity 221.

The process of assembling the PCB assembly 200 uses existing SMT processes, so the addition of a separate lining is not required. Also, a shielding can for blocking EMI is not required, which results in a reduced fabricating cost.

In the above configuration, a body PCB has a cavity within which a first electronic component is positioned. A cover PCB covers the cavity and a second electronic component that is mounted on the cover PCB is also positioned within the cavity. This PCB assembly configuration results in a high-density PCB assembly having more integrated electronic components, which in turn permits a slimmer mobile terminal 100.

The body PCB includes a body ground unit and the cover PCB includes a ground layer. The body ground unit and the ground layer are both configured to provide EMI shielding between the cavity and an area outside the PCB assembly, which results in a maximized mounting space for electronic components and provides a PCB assembly capable of providing EMI shielding.

The configurations and methods of the mobile terminal 100 in the aforesaid embodiments may not be limitedly applied. Such embodiments may be configured by a selective combination of all or part of each embodiment so as to derive many variations.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims. Therefore, all changes and modifications that fall within the metes and bounds of the claims, or equivalents of such metes and bounds are therefore intended to be embraced by the appended claims.

What is claimed is:
1. A printed circuit board assembly, comprising:
  a main printed circuit board having a first surface and a second surface;
  a first electronic component mounted on the second surface;
  a body printed circuit board having a third surface and a fourth surface, and having a cavity extending through the body printed circuit board from the third surface to the fourth surface;

a cover printed circuit board having a fifth surface and a sixth surface; and a second electronic component mounted on the fifth surface, wherein the third surface of the body printed circuit board is aligned and mounted on the second surface of the main printed circuit board such that the first electronic component is positioned within the cavity of the body printed circuit board, wherein the fifth surface of the cover printed circuit board is aligned and mounted on the fourth surface of the body printed circuit board such that the cover printed circuit board covers the cavity of the body printed circuit board and the second electronic component is also positioned within the cavity of the body printed circuit board, and wherein the cavity accommodates the first electronic component and the second electronic component therein such that the second surface on which the first electronic component is mounted and the fifth surface on which the second electronic component is mounted face each other within the cavity.

2. The printed circuit board assembly of claim 1, wherein the body printed circuit board comprises at least one body signal unit extending therethrough from the third surface to the fourth surface and configured to electrically couple the body printed circuit board to the main printed circuit board.

3. The printed circuit board assembly of claim 2, wherein the body printed circuit board further comprises a body ground unit surrounding the cavity and configured to provide electromagnetic interference (EMI) shielding between the cavity and an area outside the body printed circuit board.

4. The printed circuit board assembly of claim 3, wherein the body ground unit comprises a plurality of ground vias extending through the body printed circuit board from the third surface to the fourth surface.

5. The printed circuit board assembly of claim 4, wherein the plurality of ground vias are positioned spaced apart from one another at preset intervals along a periphery of the body printed circuit board.

6. The printed circuit board assembly of claim 5, wherein:
the at least one body signal unit comprises a plurality of body signal units; and
each body signal unit of the plurality of body signal units is positioned between a pair of the ground vias of the plurality of ground vias.

7. The printed circuit board assembly of claim 3, wherein the body ground unit comprises a layer wrapped around an external side wall of the body printed circuit board.

8. The printed circuit board assembly of claim 3, wherein the body printed circuit board further comprises a laminated plurality of insulating substrates.

9. The printed circuit board assembly of claim 3, wherein the cover printed circuit board comprises:
a signal layer including the fifth surface and having the second electronic component mounted thereon; and
a ground layer including the sixth surface and configured to cover the signal layer,
wherein the signal layer is electrically coupled to the at least one body signal unit, and
wherein the ground layer is configured to provide EMI shielding.

10. The printed circuit board assembly of claim 9, further comprising:
a third electronic component mounted on the ground layer of the cover printed circuit board and facing away from the main printed circuit board,
wherein the third electronic component is electrically coupled to the main printed circuit board via a body signal unit of the at least one body signal unit of the body printed circuit board.

11. The printed circuit board assembly of claim 3, wherein the cover printed circuit board comprises at least one ventilation hole extending therethrough between the fifth surface and the sixth surface and positioned over the cavity of the body printed circuit board.

12. The printed circuit board assembly of claim 11, further comprising:
a third electronic component mounted on the sixth surface,
wherein the cover printed circuit board further comprises:
a first region positioned at a central portion of the cover printed circuit board; and
a second region surrounding the first region of the cover printed circuit board,
wherein the at least one ventilation hole comprises a plurality of ventilation holes positioned within the second region and spaced apart from one another at preset intervals along a periphery of the first region, and
wherein the third electronic component is positioned within the second region.

13. The printed circuit board assembly of claim 3, further comprising a first coupling layer between the body printed circuit board and the main printed circuit board, the first coupling layer formed by solidification of a metal and configured to mount the body printed circuit board onto the main printed circuit board.

14. The printed circuit board assembly of claim 13, further comprising a second coupling layer between the cover printed circuit board and the body printed circuit board, the second coupling layer formed by solidification of a metal and configured to mount the cover printed circuit board onto the body printed circuit board.

15. A method for fabricating a printed circuit board assembly, the method comprising:
mounting a first electronic component onto a second surface of a main printed circuit board having a first surface and the second surface;
mounting a second electronic component onto a fifth surface of a cover printed circuit board having the fifth surface and a sixth surface;
mounting the fifth surface of the cover printed circuit board onto a fourth surface of a body printed circuit board having a third surface, the fourth surface, and a cavity extending therethrough from the third surface to the fourth surface, such that the cover printed circuit board covers the cavity of the body printed circuit board and the second electronic component is positioned within the cavity of the body printed circuit board; and
mounting the third surface of the body printed circuit board onto the second surface of the main printed circuit board such that the first electronic component is positioned within the cavity of the body printed circuit board,
wherein the cavity accommodates the first electronic component and the second electronic component therein such that the second surface on which the first electronic component is mounted and the fifth surface on which the second electronic component is mounted face each other within the cavity.

16. The method of claim 15, wherein the body printed circuit board comprises:
at least one body signal unit extending therethrough from the third surface to the fourth surface and configured to electrically couple the body printed circuit board to the main printed circuit board; and a body ground unit surrounding the cavity and configured to provide electromagnetic interference (EMI) shielding between the cavity and an area outside the printed circuit board.

17. The method of claim 16, wherein:
the body ground unit comprises a plurality of ground vias extending through the body printed circuit board from the third surface to the fourth surface; and
the plurality of ground vias are positioned spaced apart from one another at preset intervals along a periphery of the body printed circuit board.

18. The method of claim 16, wherein the body ground unit comprises a layer wrapped around an external side wall of the body printed circuit board.

19. A mobile terminal, comprising:
a terminal body; and
a printed circuit board assembly mounted in a space of the terminal body,
wherein the printed circuit board assembly comprises:
a main printed circuit board having a first surface and a second surface;
a first electronic component mounted on the second surface;
a body printed circuit board having a third surface and a fourth surface, and having a cavity extending through the body printed circuit board from the third surface to the fourth surface;
a cover printed circuit board having a fifth surface and a sixth surface; and
a second electronic component mounted on the fifth surface,
wherein the third surface of the body printed circuit board is aligned and mounted on the second surface of the main printed circuit board such that the first electronic component of the main printed circuit board is positioned within the cavity,
wherein the fifth surface of the cover printed circuit board is aligned and mounted on the fourth surface of the body printed circuit board such that the cover printed circuit board covers the cavity of the body printed circuit board and the second electronic component is positioned within the cavity of the body printed circuit board, and
wherein the cavity accommodates the first electronic component and the second electronic component therein such that the second surface on which the first electronic component is mounted and the fifth surface on which the second electronic component is mounted face each other within the cavity.

20. The mobile terminal of claim 19, wherein the body printed circuit board comprises:
at least one body signal unit extending therethrough from the third surface to the fourth surface and configured to electrically couple the body printed circuit board to the main printed circuit board; and
a body ground unit surrounding the cavity and configured to provide electromagnetic interference (EMI) shielding between the cavity and an area outside the printed circuit board.

21. The mobile terminal of claim 20, wherein:
the body ground unit comprises a plurality of ground vias extending through the body printed circuit board from the third surface to the fourth surface; and
the plurality of ground vias are positioned spaced apart from one another at preset intervals along a periphery of the body printed circuit board.

22. The mobile terminal of claim 20, wherein the body ground unit comprises a layer wrapped around an external side wall of the body printed circuit board.

* * * * *